United States Patent
Zhang et al.

(10) Patent No.: US 7,671,629 B2
(45) Date of Patent: Mar. 2, 2010

(54) SINGLE-SUPPLY, SINGLE-ENDED LEVEL CONVERSION CIRCUIT FOR AN INTEGRATED CIRCUIT HAVING MULTIPLE POWER SUPPLY DOMAINS

(75) Inventors: Shayan Zhang, Austin, TX (US); Prashant U. Kenkare, Austin, TX (US); Karen Delk, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/099,485

(22) Filed: Apr. 8, 2008

(65) Prior Publication Data

US 2009/0251173 A1 Oct. 8, 2009

(51) Int. Cl.
*H03K 19/0175* (2006.01)

(52) U.S. Cl. .............................. 326/81; 326/68; 327/333

(58) Field of Classification Search .................... 326/62, 326/63, 68, 80–83, 86, 87; 327/199–204, 327/333
See application file for complete search history.

(56) References Cited

U.S. PATENT DOCUMENTS

| | | | |
|---|---|---|---|
| 5,173,626 A | * | 12/1992 | Kudou et al. ................. 327/211 |
| 5,650,742 A | * | 7/1997 | Hirano ........................ 327/333 |
| 6,762,957 B2 | | 7/2004 | Hsu et al. |
| 7,009,424 B2 | | 3/2006 | Khan et al. |
| 7,119,578 B2 | | 10/2006 | Correale, Jr. et al. |
| 7,230,469 B2 | | 6/2007 | Benzer et al. |
| 2007/0001734 A1 | * | 1/2007 | Onouchi et al. ............. 327/218 |

* cited by examiner

*Primary Examiner*—James H. Cho
*Assistant Examiner*—Jany Tran
(74) *Attorney, Agent, or Firm*—Daniel D. Hill

(57) ABSTRACT

A circuit comprises first, second, third, and fourth transistors. The first transistor has a first current electrode, a control electrode for receiving an input signal, and a second current electrode. The second transistor has a first current electrode coupled to the second current electrode of the first transistor for providing an output signal, a control electrode coupled to the control electrode of the first transistor, and a second current electrode coupled to a first power supply voltage terminal. The third transistor has a first current electrode coupled to a second power supply voltage terminal, a control electrode, and a second current electrode coupled to the first current electrode of the first transistor. The fourth transistor has a first current electrode coupled to the control electrode of the third transistor, a control electrode coupled to the control electrodes of the first and second transistors, and a second current electrode coupled to the control electrode of the first transistor.

16 Claims, 3 Drawing Sheets

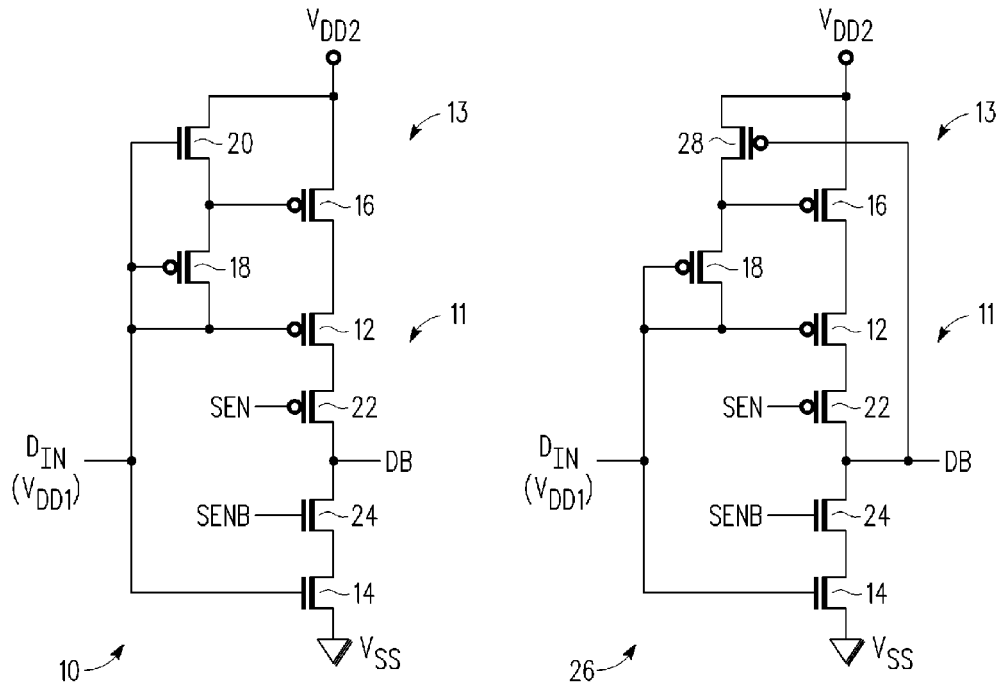
*FIG. 1*  *FIG. 2*
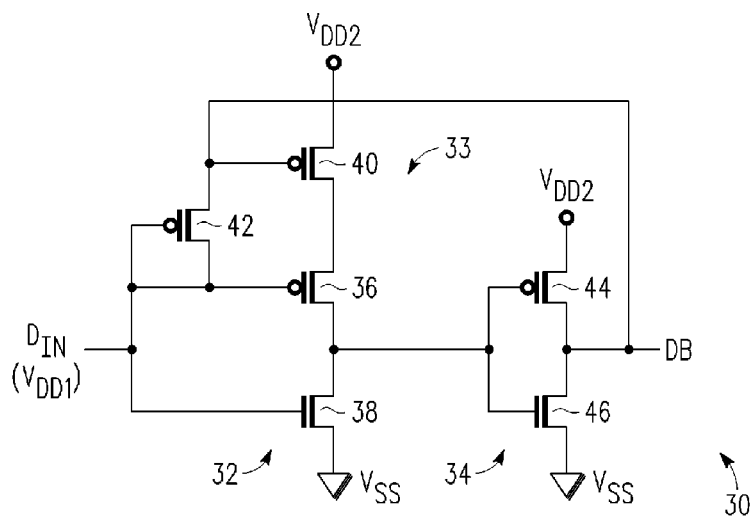
*FIG. 3*

SINGLE-SUPPLY, SINGLE-ENDED LEVEL CONVERSION CIRCUIT FOR AN INTEGRATED CIRCUIT HAVING MULTIPLE POWER SUPPLY DOMAINS

BACKGROUND

1. Field

This disclosure relates generally to electronic circuits, and more specifically, to a single-supply, single-ended level conversion circuit for multiple power supply integrated circuits.

2. Related Art

Lower power consumption has been gaining importance in integrated circuit data processing systems due to, for example, wide spread use of battery powered portable and handheld applications. Reducing leakage current is becoming an increasingly important factor in extending battery life.

In multi-core system-on-a-chip (SoC) integrated circuits, two or more power supply domains are used to achieve optimum speed, power, and reliability. Logic signals are conveyed from one power supply voltage domain to another power supply voltage domain using level conversion circuits implemented at a boundary between the domains. A leakage current path may develop if the power supply voltage from one domain is insufficient to fully turn off certain transistors of the level conversion circuit. A conventional level converter circuit may require two stages to fully level convert the logic signal. A first stage is supplied with the power supply voltage from one domain and a second stage is supplied with the power supply voltage from the other domain. However, using a level conversion circuit supplied by two power supply voltages causes routing congestion at the boundary between the two power supply domains. Also, there may be constraints on which power supply voltage is higher and constraints regarding power up and power down sequences. In addition, a conventional level conversion circuit may require differential input signals. Further, a conventional level conversion circuit may require the use of lower threshold voltage ($V_T$) transistors or dynamic precharge circuitry synchronized with data and clock signals, adding complexity to the level conversion circuit.

Therefore, what is needed is a level conversion circuit for use in an integrated circuit having multiple power supply voltage domains that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates, in schematic diagram form, a level conversion circuit in accordance with a first embodiment.

FIG. 2 illustrates, in schematic diagram form, a level conversion circuit in accordance with a second embodiment.

FIG. 3 illustrates, in schematic diagram form, a level conversion circuit in accordance with a third embodiment.

DETAILED DESCRIPTION

Figure 4:
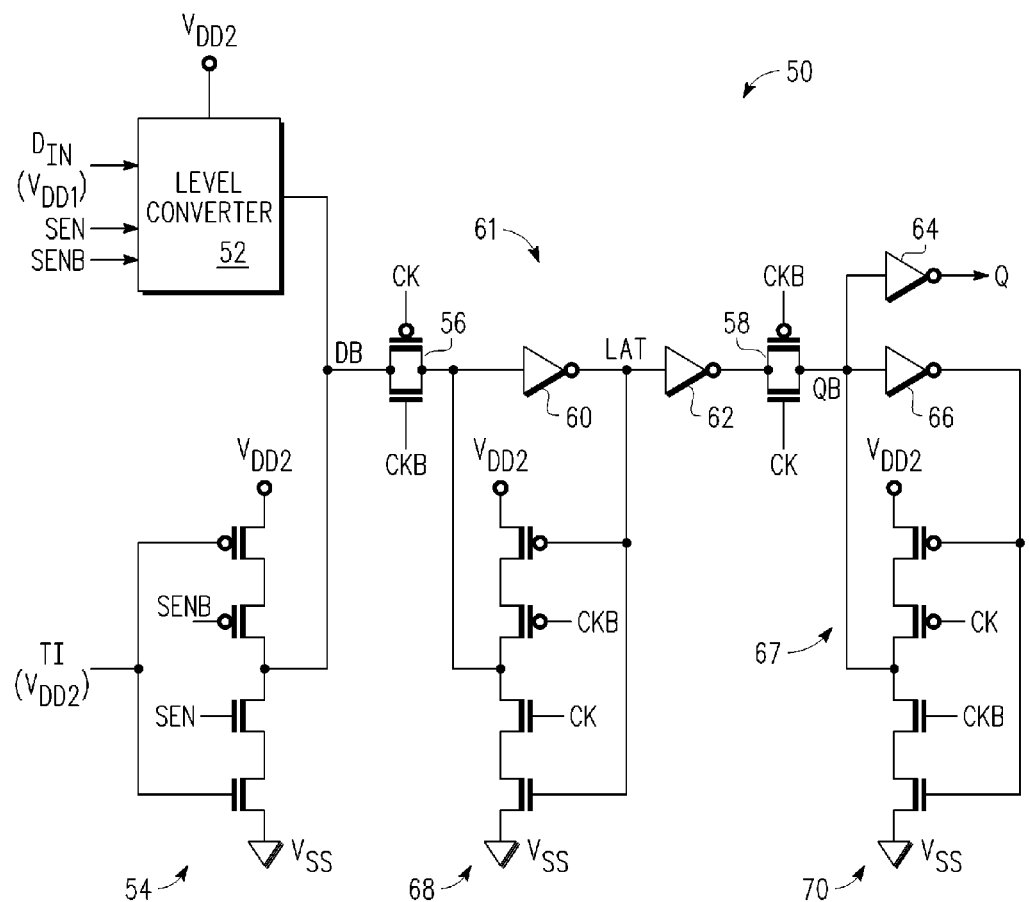
FIG. 4 illustrates, in partial block diagram form and partial schematic diagram form, a master-slave latch incorporating a level conversion circuit in accordance with FIG. 1 or FIG. 2.

Generally, there is provided, a level converting circuit for use in an integrated circuit having multiple power supply voltage domains. An input signal to the level converting circuit originates in a first power supply voltage domain and a level converted output signal of the level converting circuit is provided at a second power supply voltage domain, wherein a power supply voltage of the first power supply voltage domain is different than a power supply voltage of the second power supply voltage domain. The level converting circuit includes a leakage reduction circuit for reducing a leakage current when the input signal to the level converting circuit is a logic high voltage. The level converting circuit provides the advantage of being powered from only one of the power supply voltage domains. Also, the level converting circuit only requires a single-ended input signal. Further, there is not a constraint regarding a power up or a power down sequence of the multiple power supply domains.

In one aspect, there is provided, a circuit comprising a first transistor, a second transistor, and a leakage reduction circuit. The first transistor having a first current electrode, a control electrode for receiving an input signal, and a second current electrode. The second transistor having a first current electrode coupled to the second current electrode of the first transistor for providing an output signal, a control electrode coupled to the control electrode of the first transistor for receiving the input signal, and a second current electrode coupled to a first power supply voltage terminal. The leakage reduction circuit comprising a third transistor and a fourth transistor. The third transistor having a first current electrode coupled to a second power supply voltage terminal, a control electrode, and a second current electrode coupled to the first current electrode of the first transistor. The fourth transistor having a first current electrode coupled to the control electrode of the third transistor, a control electrode coupled to the control electrodes of the first and second transistors, and a second current electrode coupled to the control electrode of the first transistor. The circuit may further comprise an inverter having an input and an output, wherein the control electrode of the third transistor is coupled to the output of the inverter. The circuit may further comprise a fifth transistor having a first current electrode coupled to the second power supply voltage terminal, a control electrode coupled to the control electrodes of the first, second and fourth transistors, and a second current electrode coupled to the first current electrode of the fourth transistor. The circuit may further comprise a fifth transistor having a first current electrode coupled to the second power supply voltage terminal, a control electrode coupled to the second current electrode of the first transistor, and a current electrode coupled to the first current electrode of the fourth transistor. The first power supply voltage terminal may be coupled to ground and the second power supply voltage terminal may be for receiving a first power supply voltage, wherein the input signal is provided from a circuit that is supplied with a second power supply voltage, the second power supply voltage being different than the first power supply voltage. The circuit may tristateable. The tristateable circuit may further comprise a fifth transistor and a sixth transistor coupled in series between the first and second transistors, a control electrode of each of the fifth and sixth transistors for receiving a control signal. The circuit may be implemented as a portion of a master-slave flip-flop. The master-slave flip-flop may further comprise a test input for receiving a test signal. The circuit may be implemented on an integrated circuit, the integrated circuit comprising a first domain powered by a first power supply voltage and a second domain powered by a second power supply voltage, wherein the first power supply voltage is different than the second power supply voltage. The input signal may originate in the first domain and the output signal may be provided to the second domain.

In another aspect, there is provided, a circuit comprising: a first transistor having a first current electrode, a control electrode for receiving an input signal, and a second current electrode; a second transistor having a first current electrode coupled to the second current electrode of the first transistor for providing an output signal, a control electrode coupled to the control electrode of the first transistor for receiving the input signal, and a second current electrode coupled to a first power supply voltage terminal; and a leakage reduction circuit comprising: a third transistor having a first current electrode coupled to a second power supply voltage terminal, a control electrode, and a second current electrode coupled to the first current electrode of the first transistor; a fourth transistor having a first current electrode coupled to the control electrode of the third transistor, a control electrode coupled to the control electrodes of the first and second transistors, and a second current electrode coupled to the control electrode of the first transistor; and a fifth transistor having a first current electrode coupled to the second power supply voltage terminal, a control electrode, and a second current electrode coupled to the first current electrode of the fourth transistor. The control electrode of the fifth transistor may be coupled to the control electrodes of the first, second, and fourth transistors. The control electrode of the fifth transistor may be coupled to the second current electrode of the first transistor. The circuit may further comprise a fifth transistor and a sixth transistor coupled in series between the first and second transistors, a control electrode of each of the fifth and sixth transistors for receiving a control signal. The circuit may be implemented as a portion of a master-slave flip-flop. The circuit may be implemented on an integrated circuit, the integrated circuit comprising a first domain powered by a first power supply voltage and a second domain powered by a second power supply voltage, wherein the first power supply voltage is different than the second power supply voltage, and wherein the input signal is provided from the first domain and the circuit is powered by the second power supply voltage.

In yet another aspect, there is provided, a circuit comprising: a first transistor having a first current electrode, a control electrode for receiving an input signal, and a second current electrode, wherein the input signal originates from a portion of an integrated circuit powered by a first power supply voltage; a second transistor having a first current electrode coupled to the second current electrode of the first transistor for providing an output signal, a control electrode coupled to the control electrode of the first transistor for receiving the input signal, and a second current electrode coupled to a ground terminal; and a leakage reduction circuit comprising: a third transistor having a first current electrode coupled to a second power supply voltage terminal, a control electrode, and a second current electrode coupled to the first current electrode of the first transistor, wherein the second power supply voltage terminal is for receiving a second power supply voltage different from the first power supply voltage; a fourth transistor having a first current electrode coupled to the control electrode of the third transistor, a control electrode coupled to the control electrodes of the first and second transistors, and a second current electrode coupled to the control electrode of the first transistor; and a fifth transistor having a first current electrode coupled to the second power supply voltage terminal, a control electrode, and a second current electrode coupled to the first current electrode of the fourth transistor. The control electrode of the fifth transistor may be coupled to the control electrodes of the first, second, and fourth transistors. The control electrode of the fifth transistor may be coupled to the second current electrode of the first transistor.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in schematic diagram form, level conversion circuit 10 in accordance with a first embodiment. Level conversion circuit 10 is implemented on an integrated circuit using a conventional CMOS (complementary metal oxide semiconductor) process and includes P-channel transistors 12, 16, and 18 and N-channel transistors 14, 20, and 24. Transistors 12, 14, 22, and 24 form tristateable inverter 11, and transistors 16, 18, and 20 form leakage reduction circuit 13. P-channel transistor 16 has a source (current electrode) connected to power supply voltage terminal labeled "$V_{DD2}$", a gate (control electrode), and a drain (current electrode). P-channel transistor 12 has a source connected to the drain of transistor 16, a gate for receiving an input signal labeled "$D_{IN}$", and a drain. P-channel transistor 22 has a source coupled to the drain of transistor 12, a gate for receiving a control signal labeled "SEN", and a drain for providing an output signal labeled "DB". Note that a signal name ending with a "B" is a logical complement of a signal having the same name but lacking the "B". N-channel transistor 24 has a drain connected to the drain of transistor 22, a gate for receiving a control signal labeled "SENB", and a source. N-channel transistor 14 has a drain connected to the source of transistor 24, a gate connected to the gate of transistor 12, and a source coupled to a power supply voltage terminal labeled "$V_{SS}$". N-channel transistor 20 has a drain connected to $V_{DD2}$, a gate connected to the gate of transistor 12, and a source connected to the gate of transistor 16. P-channel transistor 18 has a source connected to the source of transistor 20, and a gate and a drain both connected to the gate of transistor 12.

As indicated in FIG. 1, input signal $D_{IN}$ is a digital logic signal provided from a power supply domain that is supplied with a power supply voltage labeled "$V_{DD1}$". The actual circuit supplied by $V_{DD1}$ is not important for purposes of describing FIG. 1 and is therefore not shown. Level converted output signal DB is provided in a domain supplied by $V_{DD2}$. In the illustrated embodiments, $V_{DD1}$ is a different voltage level than $V_{DD2}$. In the illustrated embodiment, $V_{DD1}$ is a lower voltage level than $V_{DD2}$. For example, $V_{DD1}$ may be provided at 0.7 volts and $V_{DD2}$ may be provided at 1.2 volts with $V_{SS}$ at ground potential. In other embodiments, the voltage levels may be different. Note that in an embodiment that does not require inverter 11 to be tristateable, transistors 22 and 24 may be omitted and the drains of transistors 12 and 14 coupled together, either directly or indirectly, to provide level converted output signal DB.

In operation, control signals SEN and SENB are deasserted, or negated, causing transistors 22 and 24 to be conductive, and thus causing inverter 11 to be enabled. Level conversion circuit 10 receives input logic signal $D_{IN}$ that transitions between a logic low voltage of about zero volts (ground) to a logic high voltage equal to approximately $V_{DD1}$. When input signal $D_{IN}$ is a logic low voltage, P-channel transistors 12 and 18 are conductive and N-channel transistors 14 and 20 is substantially non-conductive. Transistor 18 reduces a voltage at the gate of transistor 16, causing transistor 16 to be conductive. A current path then exists from $V_{DD2}$ through transistors 16, 12, and 22 causing output signal DB to be pulled up to a logic high voltage of about $V_{DD2}$.

When input signal $D_{IN}$ is a logic high voltage, N-channel transistors 14 and 20 are conductive and P-channel transistor 12 is substantially non-conductive. However, depending on the voltage level of $V_{DD1}$, the logic high voltage of input signal $D_{IN}$ may not be high enough to completely turn off P-channel transistor 12. To prevent an undesirable leakage current between $V_{DD2}$ and $V_{SS}$, the gate of P-channel transistor 16 receives a voltage equal to about $V_{DD2}$ through the conductive N-channel transistor 20. In the case where power supply voltage terminal $V_{DD2}$ receives a higher power supply voltage than $V_{DD1}$, the voltage at the gate of transistor 16 is sufficiently higher than a P-channel $V_T$ to insure that transistor 16 is completely turned off, thus reducing the leakage current. On the other hand, if $V_{DD2}$ is lower than $V_{DD1}$, the voltage at the gate of transistor 12 is sufficiently high enough to insure that transistor 12 is completely turned off, thus also reducing the leakage current.

Level conversion circuit 10 provides the advantage of having only one stage to reduce a gate delay time over level conversion circuits that have two stages. Also, level conversion circuit 10 reduces a leakage current when an input signal is a logic high, thus reducing power consumption. Also, the one stage also reduces the amount of layout area on a semiconductor die. Level conversion circuit 10 functions with a single-ended input signal and only one power supply voltage, thus reducing routing congestion at boundaries between power supply domains on an integrated circuit. In addition, level conversion circuit 10 is implemented using a conventional CMOS process and does not require special transistor types. Further, there is not a constraint regarding which power supply voltage is higher. Even further, there is not a constraint regarding a power up or a power down sequence of the two power supply domains.

FIG. 2 illustrates, in schematic diagram form, level conversion circuit 26 in accordance with a second embodiment. Level conversion circuit 26 is similar to level conversion circuit 10 except that N-channel transistor 20 is replaced with P-channel transistor 28. P-channel transistor 28 has a source connected to $V_{DD2}$, a gate connected to the drain of transistor 22, and a drain connected to the gate of transistor 16.

When input signal $D_{IN}$ is a logic low voltage and inverter 11 is enabled, level conversion circuit 26 functions the same as level conversion circuit 10. When input signal $D_{IN}$ is a logic high voltage, N-channel transistor 14 is conductive and the conductivity of P-channel transistor 12 is substantially weakened, thus N-channel transistor 14 will sink a small discharging current between the drain of transistor 22 and $V_{SS}$, causing output signal DB to be a logic low voltage equal to about ground potential. The logic low output signal DB causes P-channel transistor 28 to be conductive, thus pulling up to the gate of P-channel transistor 16 and causing P-channel transistor 16 to be substantially non-conductive. As discussed above in the description of FIG. 1, this reduces a potential leakage current through transistors 16,12, 22, when input signal $D_{IN}$ is a logic high. Also, level conversion circuit 26 has all of the advantages described above regarding level conversion circuit 10.

FIG. 3 illustrates, in schematic diagram form, level conversion circuit 30 in accordance with a third embodiment. Level conversion circuit 30 includes inverters 32 and 34. Inverter 32 includes leakage reduction circuit 33, P-channel transistor 36 and N-channel transistor 38. Inverter 34 includes P-channel transistor 44 and N-channel transistor 46. Leakage reduction circuit 33 includes P-channel transistors 40 and 42.

In level conversion circuit 30, P-channel transistor 40 has a source connected to $V_{DD2}$, a gate, and a drain. P-channel transistor 36 has a source connected to the drain of transistor 40, a gate for receiving input signal $D_{IN}$, and a drain. N-channel transistor 38 has a drain connected to the drain of transistor 36, a gate connected to the gate of transistor 36, and source connected to $V_{SS}$. The connected drains of transistors 36 and 38 form an output terminal of inverter 32. P-channel transistor 42 has a source connected to the gate of P-channel transistor 40, and a gate and a drain connected to the gate of transistor 36. The source of P-channel transistor 42 is also connected to the drain of P-channel transistor 44. P-channel transistor 44 has a source connected to $V_{DD2}$, a gate connected to the drain of transistor 36, and a drain for providing output signal DB. N-channel transistor 46 has a drain connected to the drain of transistor 44, a gate connected to the gate of transistor 44, and a source connected to $V_{SS}$. The gate of transistor 40 is connected to the drain of transistor 44. The connected drains of transistors 44 and 46 form an output terminal of inverter 34.

Unlike the embodiments described above and illustrated in FIG. 1 and FIG. 2, level conversion circuit 30 has two stages, where inverter 32 comprises a first stage and inverter 34 comprises a second stage. When input signal $D_{IN}$ is a logic low voltage, transistor 36 is conductive and transistor 38 is substantially non-conductive. P-channel transistor 42 is conductive, causing the gate of P-channel transistor 40 to be pulled low to a voltage equal to about $V_{SS}$. P-channel transistor 40 is therefore conductive, causing the output terminal of inverter 32 to be a logic high voltage equal to about $V_{DD2}$. Inverter 34 then provides a logic low output signal DB. The logic low signal DB is fed back to the gate of transistor 40.

When input $D_{IN}$ is a logic high voltage, transistor 36 is substantially non-conductive and transistor 38 is conductive, causing the output terminal of inverter 32 to be a logic low voltage. The output signal DB will therefore be a logic high voltage equal to about $V_{DD2}$. P-channel transistor 42 is biased with the logic high input signal $D_{IN}$. Because $D_{IN}$ is provided by a power supply domain that receives $V_{DD1}$, a voltage at the gate of transistor 42 will be about $V_{DD1}$, causing transistor 42 to be substantially non-conductive. The logic high output signal DB is then fed back to the gate of transistor 40. Transistor 40 will be substantially non-conductive. Because the gate voltage of P-channel transistor 40 is equal to about $V_{DD2}$, transistor 40 is insured of being completely turned off, thus reducing a leakage current between $V_{DD2}$ and $V_{SS}$.

Like the circuits illustrated in FIG. 1 and FIG. 2 and discussed above, level conversion circuit 30 provides the advantages of requiring only a single-ended input signal and can be implemented using a conventional CMOS process. However, compared to level conversion circuits 10 and 26, level conversion circuit 30 has the disadvantage of requiring two stages.

FIG. 4 illustrates, in partial block diagram form and partial schematic diagram form, master-slave latch 50 incorporating the level conversions circuits 10 and 26 of either FIG. 1 or FIG. 2, respectively. Master-slave latch 50 is provided as one example of a circuit implementing level conversion circuits 10 and 26. In other embodiments, other types of circuits can be used.

Latch 50 includes level converter 52, transmission gates 56 and 58, and inverters 54, 60, 62, 64, 66, 68, and 70. Inverters 60 and 68 form a cross-coupled latch 61, and inverters 66 and 70 form a cross-coupled latch 67. An output of level converter 52 is coupled to an input of transmission gate 56. Transmission gate 56 has clock inputs for receiving clock signals CK and CKB. Latch 61 has an input coupled to the output of transmission gate 56, and an output coupled to an input of inverter 62. Inverter 68 of latch 61 includes clock inputs for receiving clock signal CK and CKB. The output of inverter 60 is labeled "LAT". Transmission gate 58 has an input coupled to the output of inverter 62, an output coupled to an input of latch 67 and inverter 64, and clock inputs for receiving clock signals CK and CKB. The output of transmission gate 58 is labeled "QB".

Level converter 52 can be implemented using either level conversion circuit 10 or level conversion circuit 26. Level conversion circuit 30 of FIG. 3 can also be used if the additional inverter 34 is taken into account.

Figure 5:
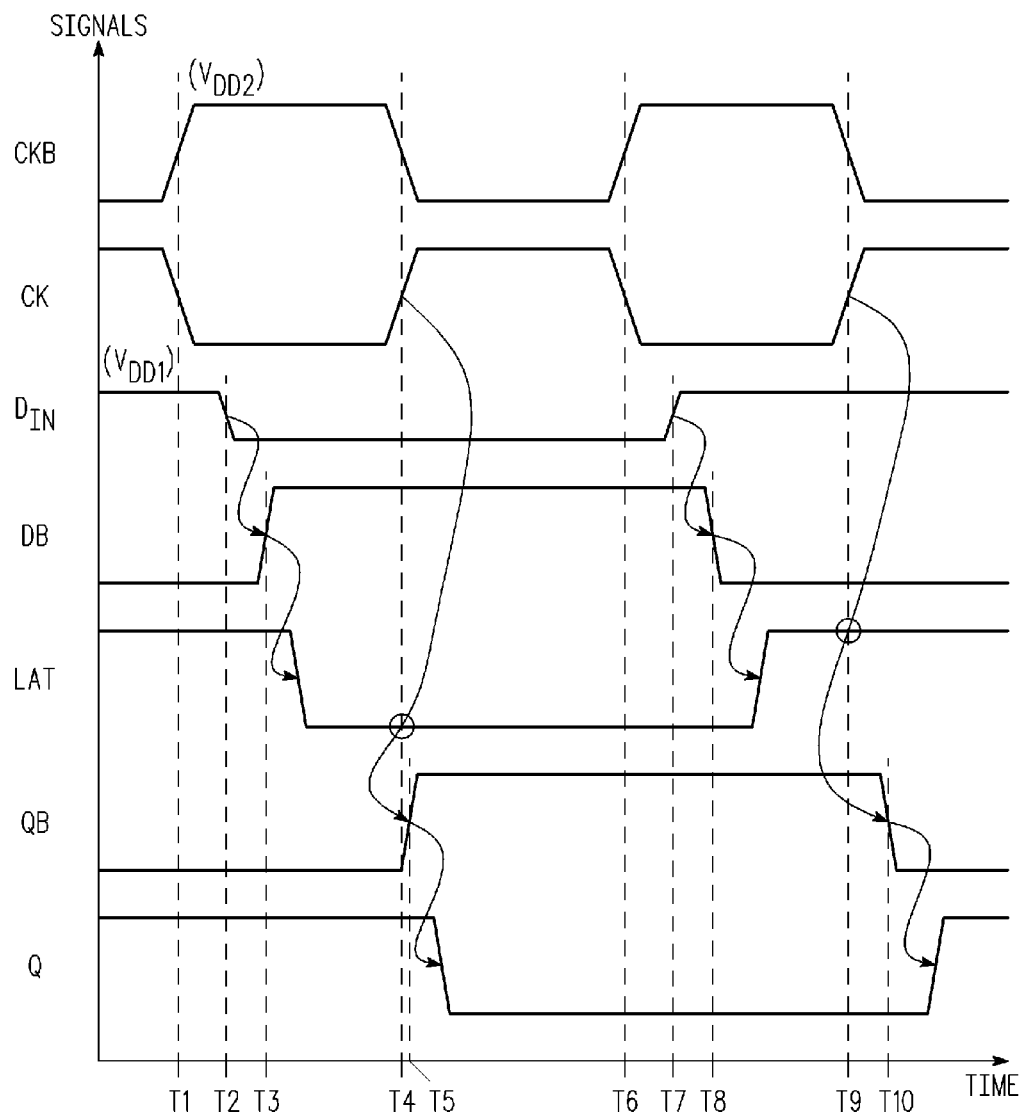
FIG. 5 illustrates a timing diagram of various signals of the master-slave latch of FIG. 4.

In operation, either a test signal is provided at an input of inverter 54 or a data signal is provided depending on whether or not control signals SEN and SENB are asserted or negated. FIG. 5 illustrates a timing diagram of various signals of master-slave latch 50 of FIG. 4. The operation of master-slave latch 50 will be discussed referring to both FIG. 4 and FIG. 5. When control signal SEN is negated as a logic low, inverter 54 is disabled and level converter 52 is enabled. All of the signals indicated in FIG. 5 have a logic high voltage equal to about $V_{DD2}$ except for input signal $D_{IN}$. Prior to time T1, data input signal $D_{IN}$ is a logic high voltage equal to about $V_{DD1}$ and signal DB is a logic low. Latch signal LAT is a logic high, signal QB is a logic low, and signal Q is a logic high. Time T1 indicates a falling edge of clock signal CK and a rising edge of clock signal CKB. After clock signal CK transitions low, transmission gate 56 is conductive and transmission gate 58 is non-conductive. At time T2, data input signal $D_{IN}$ transitions to a logic low voltage causing signal DB to be a logic high at time T3. Inverter 60 then provides a logic low signal LAT at its output in response to the logic high DB. Note that inverter 68 is disabled, or tristated, when clock signal CK is low and inverter 70 is enabled when clock signal CK is low. The logic state of QB is latched by latch 67. At time T4, clock signal CK again transitions to a logic high. Transmission gate 56 is made non-conductive and the logic low signal LAT is latched by latch 61. Transmission gate 58 is conductive, causing signal QB to become a logic high and signal Q to become a logic low at time T5 in response to the logic low signal LAT.

At time T6, clock signal CK transitions to a logic low. At time T7, input signal $D_{IN}$ transitions to a logic high. The logic high signal $D_{IN}$ causes signal DB to become a logic low at time T8. Transmission gate 56 is conductive and transmission gate 58 is non-conductive. Signal LAT becomes a logic high in response to the logic low signal DB via transmission gate 56. Inverter 68 is disabled and inverter 70 is enabled causing the previous logic state of QB from the previous clock cycle to be latched in cross-coupled latch 67. At time T9, clock signal CK again transitions to a logic high. Transmission gate 56 becomes non-conductive and transmission gate 58 becomes conductive. Inverter 68 is enabled and the logic state of signal LAT is latched in cross-coupled latch 61. Inverter 70 is disabled, and the logic state of signals Q and QB are allowed to transition in response to signal LAT.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary level converter circuit, this circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of level conversion circuits are circuitry located on a single integrated circuit or within a same device. Alternatively, the level conversion circuits may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit comprising:
    a first transistor having a first current electrode, a control electrode for receiving an input signal, and a second current electrode;
    a second transistor having a first current electrode coupled to the second current electrode of the first transistor for providing an output signal, a control electrode coupled to the control electrode of the first transistor for receiving the input signal, and a second current electrode coupled to a first power supply voltage terminal;
    an inverter having an input coupled to the second current electrode of the first transistor, and an output; and
    a leakage reduction circuit comprising:
        a third transistor having a first current electrode coupled to a second power supply voltage terminal, a control electrode coupled to the output of the inverter, and a second current electrode coupled to the first current electrode of the first transistor; and
        a fourth transistor having a first current electrode coupled to the control electrode of the third transistor, a control electrode coupled to the control electrodes of the first and second transistors, and a second current electrode coupled to the control electrode of the first transistor.

2. The circuit of claim 1, wherein the first, third, and fourth transistors are P-channel transistors and the second transistor is an N-channel transistor.

3. The circuit of claim 1, wherein the first power supply voltage terminal is coupled to ground and the second power supply voltage terminal is for receiving a first power supply voltage, wherein the input signal is provided from a circuit that is supplied with a second power supply voltage, the second power supply voltage being different than the first power supply voltage.

4. The circuit of claim 1, wherein the circuit is tristateable.

5. The circuit of claim 4, further comprising a fifth transistor and a sixth transistor coupled in series between the first and second transistors, a control electrode of each of the fifth and sixth transistors for receiving a control signal.

6. The circuit of claim 1, wherein the circuit is implemented as a portion of a master-slave flip-flop.

7. The circuit of claim 6, wherein the master-slave flip-flop further comprises a test input for receiving a test signal.

8. The circuit of claim 1, wherein the circuit is implemented on an integrated circuit, the integrated circuit comprising a first domain powered by a first power supply voltage and a second domain powered by a second power supply voltage, wherein the first power supply voltage is different than the second power supply voltage.

9. The circuit of claim 8, wherein the input signal originates in the first domain and the output signal is provided to the second domain.

10. A circuit comprising:
    a first transistor having a first current electrode, a control electrode for receiving an input signal, and a second current electrode;
    a second transistor having a first current electrode coupled to the second current electrode of the first transistor for providing an output signal, a control electrode coupled to the control electrode of the first transistor for receiving the input signal, and a second current electrode coupled to a first power supply voltage terminal; and
    a leakage reduction circuit comprising:
        a third transistor having a first current electrode coupled to a second power supply voltage terminal, a control electrode, and a second current electrode coupled to the first current electrode of the first transistor;
        a fourth transistor having a first current electrode coupled to the control electrode of the third transistor, a control electrode coupled to the control electrodes of the first and second transistors, and a second current electrode coupled to the control electrode of the first transistor; and
        a fifth transistor having a first current electrode coupled to the second power supply voltage terminal, a control electrode connected to the control electrode of the first, second, and fourth transistors, and a second current electrode coupled to the first current electrode of the fourth transistor.

11. The circuit of claim 10, wherein the first, third, and fourth transistors are P-channel transistors and the second and fifth transistors are N-channel transistors.

12. The circuit of claim 10, further comprising a sixth transistor and a seventh transistor coupled in series between the first and second transistors, a control electrode of each of the sixth and seventh transistors for receiving a control signal.

13. The circuit of claim 10, wherein the circuit is implemented as a portion of a master-slave flip-flop.

14. The circuit of claim 10, wherein the circuit is implemented on an integrated circuit, the integrated circuit comprising a first domain powered by a first power supply voltage and a second domain powered by a second power supply voltage, wherein the first power supply voltage is different than the second power supply voltage, and wherein the input signal is provided from the first domain and the circuit is powered by the second power supply voltage.

15. A circuit comprising:
    a first transistor having a first current electrode, a control electrode for receiving an input signal, and a second current electrode, wherein the input signal originates from a portion of an integrated circuit powered by a first power supply voltage;
    a second transistor having a first current electrode coupled to the second current electrode of the first transistor for providing an output signal, a control electrode coupled to the control electrode of the first transistor for receiving the input signal, and a second current electrode coupled to a ground terminal; and a leakage reduction circuit comprising:

a third transistor having a first current electrode coupled to a second power supply voltage terminal, a control electrode, and a second current electrode coupled to the first current electrode of the first transistor, wherein the second power supply voltage terminal is for receiving a second power supply voltage different from the first power supply voltage;

a fourth transistor having a first current electrode coupled to the control electrode of the third transistor, a control electrode coupled to the control electrodes of the first and second transistors, and a second current electrode coupled to the control electrode of the first transistor; and a fifth transistor having a first current electrode coupled to the second power supply voltage terminal, a control electrode connected to the control electrode of the first, second, and fourth transistors, and a second current electrode coupled to the first current electrode of the fourth transistor.

16. The circuit of claim 15, wherein the first, third, and fourth transistors are P-channel transistors and the second and fifth transistors are N-channel transistors.

* * * * *